METHOD FOR MAKING A HOT CARRIER PN-DIODE

Filed Dec. 26, 1968

INVENTORS
Jack L. Saltich
James L. Rutledge
BY
Mueller, Aichele & Rauner
ATTY'S.

3,550,260

METHOD FOR MAKING A HOT CARRIER PN-DIODE

Jack L. Saltich, Scottsdale, and James L. Rutledge, Tempe, Ariz., assignors to Motorola, Inc., Franklin Park, Ill., a corporation of Illinois Filed Dec. 26, 1968, Ser. No. 787,024
Int. Cl. H01l 5/02, 7/00
U.S. Cl. 29—576 13 Claims

ABSTRACT OF THE DISCLOSURE

Disclosed is a Schottky barrier or hot carrier diode and process for making same wherein a diffused PN junction and a Schottky barrier junction are both formed in a body of semiconductor material. The diffused PN junction is formed by first diffusing an impurity through an opening in a diffusion mask and into one surface of the semiconductor body to form PN junction. Next, a large central portion of the region formed by the above diffusion is removed by etching or cutting, leaving unaffected by the etchant only that portion of the diffused region underlying and adjacent to the diffusion mask on the surface of the semiconductor body. The latter portion of the diffused region forms a relatively small area diffused PN junction. Finally, a Schottky barrier junction is formed in the etched out area of the semiconductor body, and the diode including the diffused and Schottky barrier junctions has a near-ideal current-voltage characteristic and still maintains its fast recovery time.

BACKGROUND OF THE INVENTION

This invention relates generally to semiconductor diodes and more particularly to a hot carrier or Schottky barrier diode particularly suited for high frequency applications.

The hot carrier diode is a new high frequency and microwave semiconductor device that effectively bridges the gap between the PN junction diode and the old standby point contact diode. The hot carrier diode rivals the point contact diode in high frequency performance, and surpasses it in uniformity, reproducibility and reliability. Unlimited by charge storage phenomena and exhibiting extremely low noise characteristics, the hot carrier diode is particularly suitable for fast switching in high frequency computers and as a mixer, detector, and rectifier element extending into the microwave region.

The hot carrier diode includes a rectifying metal-semiconductor junction, and the metal-semiconductor interface can be formed using a variety of metals in conjunction with either N type or P type silicon. In general, N type silicon is preferred because the higher electron mobility in the N type silicon permits better high frequency performance. Diodes using evaporated gold, platinum, palladium, silver and many other metals have been built for a variety of specific applications.

Unlike the PN junction diode, the hot carrier diode is based on majority carrier conduction and in normal operation exhibits virtually no storage of minority carriers. The operation of the Schottky barrier diode is similar to that of the ideal point contact diode inasmuch as both diodes employ a Schottky barrier. However, the practical point contact diode employs a short metal whisker to make contact with the semiconductor element, thereby producing an essentially hemispherical rectifying junction. On the other hand, the hot carrier diode employs a true Schottky barrier consisting of a plane area contact between the metal and the semiconductor element. This plane area contact results in a uniform contact potential and uniform current distribution through the metal semiconductor contact. The latter feature results in a low series resistance, a low noise characteristic, a high power capability and a high resistance to transient pulse burnout.

In the fabrication of Schottky barrier diodes, it is sometimes desirable to form a diffused guard ring in the structure to eliminate the so-called junction curvature effect. This type of guard ring has been previously described in an article by M. P. Lepseltzer and S. M. Sze entitled, "Silicon Schottky Barrier Diode with Near-Ideal I–V Characteristics," Bell System Telephone Journal, vol. 47, No. 2, February 1968, issue. This guard ring improves both the forward and reverse characteristics of the diode. However, as a result of the formation of the diffused guard ring in the Schottky barrier diode structure, there is produced a carrier injection from the diffused PN junction of the guard ring to the adjacent semiconductor material of the diode, and this carrier injection increases the switching time of the diode. The carrier injection increases as area of the diffused junction is increased, so it is extremely important to maintain a large ratio of hot carrier junction area-to-diffused guard ring PN junction area if optimum device performance is to be obtained.

SUMMARY OF THE INVENTION

An object of the present invention is to provide a new and improved hot carrier or Schottky barrier diode which exhibits a near-ideal current-voltage characteristic of a Schottky barrier guard ring diode and maintains a fast switching capability.

Another object of this invention is to provide a new and improved process for fabricating Schottky barrier diodes. This process is easy to follow and employs a novel combination of process steps.

The present invention features a Schottky barrier diode having a high ratio of Schottky barrier junction area to diffused guard ring PN junction area. In this diode, the carrier injection from the diffused PN junction is maintained at a minimum.

Another feature of the present invention is the provision of a process for fabricating Schottky barrier diodes. In this process, a diffused region is initially formed in a semiconductor body and defines a relatively wide area PN junction. Thereafter, by etching or cutting substantially normal to the surface of the diffused region, substantially all of this region is removed. After etching or cutting, only those portions of the diffused region which are substantially covered and protected by a diffusion mask remain and form an annular guard ring having a very small PN junction area. The minimum PN junction area minimizes carrier injection from the diffused PN junction into the adjacent bulk semiconductor material.

These and other objects and features of this invention will become more fully apparent in the following description of the accompanying drawings.

THE INVENTION

Figure 1:
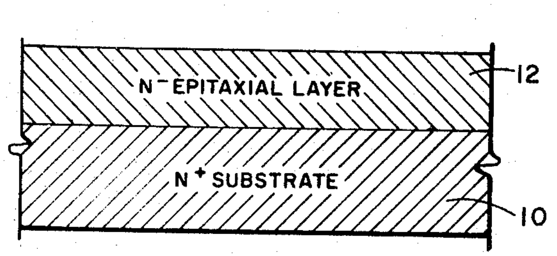
FIG. 1 is a cross section view of the semiconductor starting material used in the present process and includes an N+ substrate upon which an N− epitaxial layer has been formed.
Figure 2:
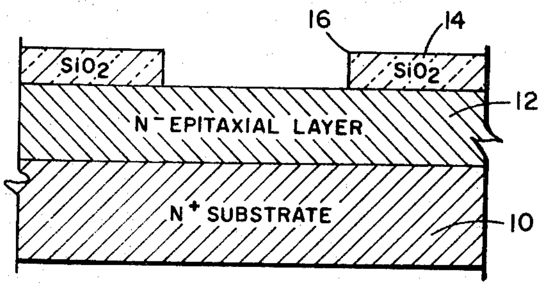
FIG. 2 illustrates the formation of a diffusion mask for the semiconductor structure in FIG. 1.

Briefly described, the present invention is directed to a novel hot carrier Schottky barrier diode and process for making same wherein first and second regions of opposite conductivity type semiconductor material are formed in a semiconductor body. The second region initially forms a relatively wide area diffused PN junction with the first region. Next, a substantial portion of the second region is removed by etching or cutting through the portion of the second region, such portion being exposed by an opening in the mask through which the second region was formed. The latter step leaves only the extreme or peripheral portion of the second region which now forms a relatively small area PN junction with the first region when compared with the area of the removed portion. A rectifying contact forming material is then applied to the exposed portions of the first and second regions to thereby form a Schottky barrier junction at the first region and an essentially ohmic contact at the second region. The process according to this invention permits the fabrication of a Schottky barrier diode wherein the ratio of Schottky barrier junction area to the first formed PN junction area is relatively high and thereby minimizes carrier injection from the first formed PN junction into the adjacent semiconductor material. By minimizing this carrier injection from the first formed PN junction, maximum switching speeds are maintained.

Referring to the drawing in more detail, there is shown an N+ semiconductor substrate 10 which has an N— semiconductor epitaxial layer 12 formed thereon using known epitaxial state of the art techniques. Using known masking and photoresist processes, an oxide layer 14 consisting of a diffusion mask is formed on the upper surface of the epitaxial layer 12. The layer or mask 14 has a relatively large opening 16 therein through which an impurity is allowed to pass and form a P+ type region 18 within the N— epitaxial layer 12. The now remaining portion 13 of the original N— epitaxial layer 12 and the P+ region 18 will be alternatively referred to herein as the first and second regions, respectively.

Figure 3:
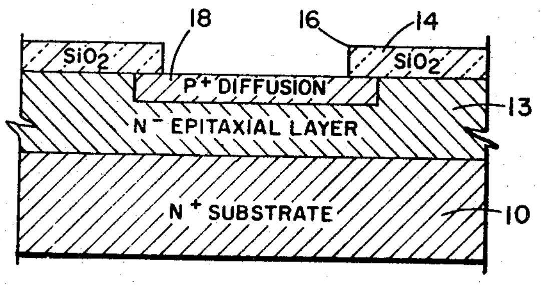
FIG. 3 illustrates the formation of a P+ region in the N− epitaxial layer of the semiconductor structure.
Figure 4:
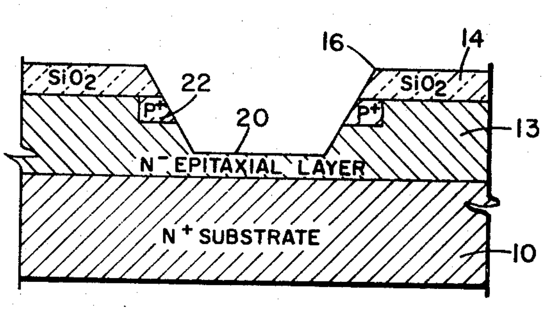
FIG. 4 illustrates the removal of a substantial portion of the P+ region formed within the N− epitaxial layer.

Next, the uncovered and exposed surface of the second region 18 in FIG. 3 is subjected to a suitable semiconductor etchant, such as potassium hydroxide (KOH), for times ranging typically from five to thirty minutes and at elevated temperatures in the order of 100° C. However, the potassium hydroxide etchant will etch only a [100] crystal orientation so that the epitaxial layer 12 must be formed with this crystal orientation if the KOH etchant is used. The potassium hydroxide etchant etches in a direction substantially normal to the surface of the second region 18 and removes a frusto-conical portion of the second and first regions 18 and 13, respectively. After the etching step illustrated in FIG. 4 is completed, the only P+ material remaining is the extreme or peripheral portion 22 of the second region 18. This extreme portion 22, which is partially covered by the diffusion mask 14, defines a relatively small area diffused PN junction in the guard ring geometry.

Figure 5:
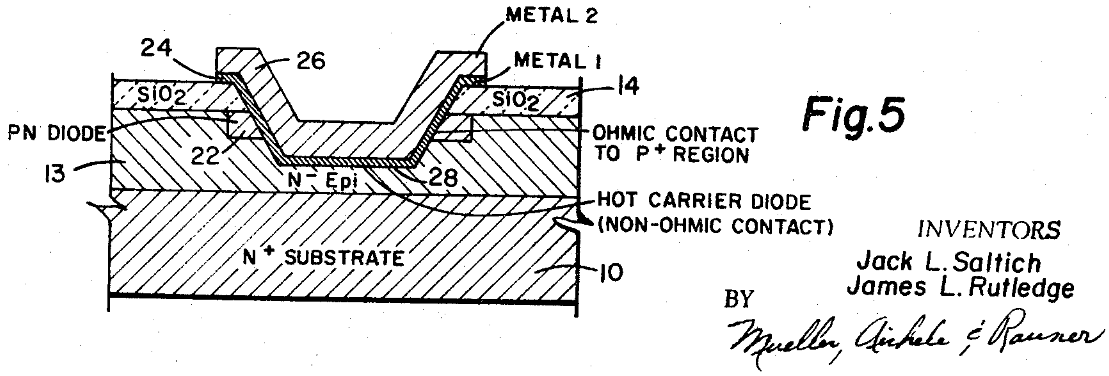
FIG. 5 illustrates the completion of the semiconductor Schottky barrier diode by the application of metal layers thereto.

Next, a rectifying contact forming material 24 identified as "metal 1" is deposited on the exposed areas of the first and second regions 13 and 22 as shown in FIG. 5. Within the scope of this invention, it is only necessary that the material 24 have the ability to form a rectifying contact at the Schottky barrier junction interface 28 and an ohmic contact at the metal-silicon interface of the silicon in region 22. If the rectifying contact forming material 24 is to have a high Schottky barrier height, a low reverse leakage current and a relatively low forward current, then materials such as aluminum, gold, silver and platinum silicide are suitable for the rectifying contact forming material 24. If the Schottky barrier junction height is not required to be very high and if relatively high reverse leakage and high forward currents are not objectionable, then metals such as titanium, molybdenum, chromium and nickel may be used for the rectifying contact forming material 24.

The material 24 may be deposited as shown in FIG. 5 by any number of well-known methods such as vacuum deposition, film evaporation, electron beam evaporation, sputtering, etc.

To provide good bonding contact to the diode, a second layer of metal 26 is deposited on the rectifying contact forming material 24, and gold, aluminum, platinum, and various copper alloys have been found suitable for the "metal 2" shown in FIG. 5.

It should be understood that the above described process is only an illustrative embodiment of the invention and may be modified by those skilled in the art within the scope of the invention. For example, the formation of the second region 18 is not limited to the diffusion process. Region 18 may be formed, for example, by an ion implantation process where high energy ions are accelerated in an electric field and caused to penetrate the exposed surface of the epitaxial layer 12.

Additionally, the diffusion mask 14 is not limited to a silicon dioxide mask and may for example be a silicon nitride material or other material that will protect the surface of the semiconductor body as described above. Accordingly, the present invention is limited only by way of the following appended claims.

We claim:

1. A process for fabricating a hot carrier diode which includes the steps of:

(a) converting the conductivity of a portion of a semiconductor body to thereby provide first and second regions therein of opposite conductivity type semiconductor material;

(b) removing a substantial portion of said second region from its central area while exposing said first region through the same area and leaving a peripheral portion of said second region remaining within said semiconductor body with said first and the remaining portion of said second region forming a PN junction of smaller area than the area of the removed portion, and (c) applying a rectifying contact forming material to the areas exposed by the material removed from both said first and second regions to form a Schottky barrier junction at the interface of said material and said first region and an ohmic contact at the interface of said material and said second region, said Schottky barrier junction being electrically in parallel with said PN junction, and the ratio of the area of the Shottky barrier junction to the area of the PN junction being greater than unity to thereby minimize carrier injection from the PN junction to the surrounding semiconductor material.

2. The process defined in claim 1 wherein said rectifying contact forming material is selected from the group consisting of aluminum, gold, silver and platinum silicide whereby the barrier height of said Shottky barrier junction is relatively high.

3. The process defined in claim 1 wherein said rectifying contact forming material is selected from the group consisting of titanium, molybdenum, chromium and nickel whereby the barrier height of said Schottky barrier junction is relatively low.

4. The process defined in claim 2 which further includes applying a bonding contact to the surface of said material to form a good bonding surface for said diode, said bonding contact being a metal selected from the group consisting of gold, aluminum, platinum and copper alloys.

5. The process defined in claim 3 which further includes applying a bonding contact to the surface of said material to form a good bonding surface for said diode, said bonding contact being a metal selected from the group consisting of gold, aluminum, platinum and copper alloys.

6. A process for fabricating a hot carrier Schottky barrier diode which includes the steps of:

(a) forming a mask on the surface of a semiconductor body, (b) selectively converting the conductivity of a portion of said semiconductor body to thereby provide first and second regions within said semiconductor body of opposite conductivity type semiconductor material, (c) removing a portion of said second region which is exposed by an opening in said mask and thereby leaving the peripheral portion of said second region at least partially covered by said mask, said peripheral portion of said second region forming a PN junction with said first region, and (d) applying a rectifying contact forming material to the area of said first region exposed by the removed portion of said second region to form therewith a Schottky barrier junction at the interface of said material and said first region and to form an ohmic contact with said second region, the ratio of area of said Schottky barrier junction to the area of said PN junction being greater than unity to minimize carrier injection from said PN junction to the surrounding semiconductor material, whereby the switching speed of said Schottky barrier diode is maintained at a maximum.

7. The process defined in claim 6 wherein said material is selected from the group consisting of aluminum, gold, silver and platinum silicide thereby providing a relatively high barrier height and low reverse leakage current for said Schottky barrier junction.

8. The process defined in claim 6 wherein said material is selected from the group consisting of titanium, molybdenum, chromium and nickel thereby providing a relatively low barrier height, a relatively high reverse leakage current and a relatively high forward current for said Schottky barrier junction.

9. The process defined in claim 7 which further includes applying a bonding contact to said material for providing a good bonding surface for said diode, said bonding contact selected from the group consisting of gold, aluminum, platinum and copper alloys.

10. The process defined in claim 8 which further includes applying a bonding contact to said material for providing a good bonding surface for said diode, said bonding contact selected from the group consisting of gold, aluminum, platinum and copper alloys.

11. The process defined in claim 6 wherein the formation of said mask includes:

(a) forming a layer of silicon oxide on the surface of said semiconductor body, and (b) selectively removing a portion of said silicon oxide thereby forming said opening through which an opposite conductivity type impurity passes in the formation of said second region.

12. The process defined in claim 11 wherein (a) the selective conversion of the conductivity of said semiconductor body includes diffusing an impurity through said opening in said silicon oxide and lateral to the surface of said semiconductor body whereby said impurity diffuses underneath the silicon oxide layer on the surface of said semiconductor body and remains covered thereby, and (b) the removal of a portion of said second region includes etching the portion of said second region which is exposed by said opening in said silicon dioxide mask to completely remove the central portion of said second region and leave only the peripheral portion of said second region partially covered by said silicon oxide layer.

13. The process defined in claim 12 which further includes depositing an N− epitaxial layer on an N+ semiconductor substrate thereby forming relatively high resistivity layer within which said first and second regions are formed, said high resistivity layer being formed prior to the formation of said silicon dioxide mask on the surface of said semiconductor body.

References Cited

UNITED STATES PATENTS

| | | | |
|---|---|---|---|
| 3,099,591 | 7/1963 | Shackley | 317—235X |
| 3,252,062 | 5/1966 | Kooi | 317—235 |
| 3,309,241 | 3/1967 | Dickson, Jr. | 317—234X |
| 3,463,971 | 8/1969 | Sashea et al. | 317—234 |

JAMES D. KALLAM, Primary Examiner

U.S. Cl. X.R.

317—234